United States Patent [19]

Imura

[11] Patent Number: 5,719,534
[45] Date of Patent: Feb. 17, 1998

[54] SEMICONDUCTOR INTEGRATED CIRCUIT HAVING LOW POWER CONSUMPTION OSCILLATOR

[75] Inventor: Satoru Imura, Tokyo, Japan

[73] Assignee: NEC Corporation, Tokyo, Japan

[21] Appl. No.: 594,298

[22] Filed: Jan. 30, 1996

[30] Foreign Application Priority Data

Jan. 30, 1995 [JP] Japan ................... 7-013142

[51] Int. Cl.$^6$ .................. H03B 5/06; H03L 5/00
[52] U.S. Cl. .................. 331/186; 331/116 FE; 331/158
[58] Field of Search ............ 331/116 FE, 108 D, 331/158, 185, 186

[56] References Cited

U.S. PATENT DOCUMENTS

| | | | |
|---|---|---|---|
| 3,999,368 | 12/1976 | Yoshida | 331/158 |
| 4,282,496 | 8/1981 | Heuner | 331/116 FE |
| 4,956,618 | 9/1990 | Ulmer | 331/116 FE |
| 5,247,266 | 9/1993 | Ogata | 331/185 |

FOREIGN PATENT DOCUMENTS

| | | |
|---|---|---|
| 0 320 969 | 6/1989 | European Pat. Off. . |
| 55-163477 | 12/1980 | Japan . |
| 63-156218 | 6/1988 | Japan . |
| 63-175909 | 7/1988 | Japan . |
| 5-218740 | 8/1993 | Japan . |

*Primary Examiner*—Siegfried H. Grimm
*Attorney, Agent, or Firm*—Young & Thompson

[57] ABSTRACT

A semiconductor integrated circuit has a constant voltage generation circuit and an oscillation circuit for generating a clock signal. The constant voltage generation circuit supplies a first voltage to the oscillation circuit until the clock signal is stabilized and the constant voltage generation circuit supplies a second voltage lower than the first voltage to the oscillation circuit after the clock signal has been stabilized.

4 Claims, 3 Drawing Sheets

SEMICONDUCTOR INTEGRATED CIRCUIT HAVING LOW POWER CONSUMPTION OSCILLATOR

BACKGROUND OF THE INVENTION

1. Field of the Invention

The present invention relates to a semiconductor integrated circuit and, more particularly, to a semiconductor integrated circuit having a lower power consumption oscillation circuit.

2. Description of the Related Art

Recent semiconductor integrated circuits (ICs) need an oscillator circuit for generating a system clock. In some semiconductor integrated circuits, there has been adopted a technique of decreasing a supply voltage to the IC, and suspending a clock signal or decreasing the frequency of the clock signal when the IC is in standby mode.

For example, FIG. 4 shows a block diagram of a one-chip microcomputer disclosed in Japanese Patent laid-open Sho 63-175909. This one-chip microcomputer includes a microcomputer internal unit 31, a clock signal control circuit 32, and a supply voltage control circuit 33. The supply voltage control circuit 33 is comprised of supply voltage selection p-type transistors 331 and 332, supply voltage drop n-type transistors 334 and 335, and an inverter 333.

During normal operation mode, a standby signal $\overline{STOP}$ is at a high level. The clock signal control circuit 32 therefore outputs a clock signal CLK input thereto. The supply voltage control circuit 33 outputs a supply voltage Vcc because the supply voltage selection p-type transistor 332 is rendered conductive.

On the other hand, when the microcomputer changes over to the standby made, the standby signal $\overline{STOP}$ goes to a low level. The clock signal control circuit 32 therefore suspends the output of the clock signal CLK. The supply voltage control circuit 33 at this time outputs a voltage that has dropped from the supply voltage Vcc, through the supply voltage drop n-type transistors 334 and 335, because the supply voltage selection p-type transistor 331 has been rendered conductive.

In this way, in the standby mode, the supply voltage to be supplied to the microcomputer internal unit 31 is set to a low voltage, and the supply of the clock signal is suspended, thereby to reduce the power consumption of the semiconductor integrated circuit.

FIG. 5 shows a block diagram of a starting unit for the microcomputer disclosed in Japanese Patent laid-open Sho 63-156218. The starting unit for the microcomputer includes a microcomputer 41, a constant-voltage generating circuit 42, a standby power supply 43, a clock supply circuit 44, a reset circuit 45, a low-speed clock oscillation circuit 46, and a diode 47.

After the power supply has been turned on and a constant voltage has been output from the constant-voltage generation circuit 42 under control of a supply voltage change-over signal output from the microcomputer 41, the clock supply circuit 44 starts to operate and outputs a stable clock. Upon this operation, the reset circuit 45 releases a reset signal, and the microcomputer 41 starts to operate. During operation, the microcomputer 41 operates on the basis of the clock outputted from the clock supply circuit 44.

On the other hand, when the microcomputer 41 goes to the standby mode, a clock change-over signal is produced within microcomputer 41 which allows the clock signal to be changed over from the output of the clock supply circuit 44 to the output of the low-speed clock oscillation circuit 46. Also the constant-voltage generation circuit 42 is controlled in accordance with the supply voltage change-over signal from an output terminal thereby to cease the constant-voltage output.

As described above, the microcomputer 41 is supplied with a low supply voltage from the standby power supply 43 through the diode 47, and supplied with the low-speed clock signal from the low-speed clock generation circuit 46, thereby to reduce the power consumption of the IC in the standby mode.

The above-mentioned conventional ICs are so designed as to require that the supplied clock signal is suspended or the frequency of the clock is lowered because the supply voltage to the entire internal circuit is changed over to a low voltage. As a result, only when the microcomputer is in the standby mode, can the power consumption of the ICS be reduced.

However, in the above-mentioned conventional ICS, the oscillator is still operating in the standby mode. The conventional oscillator, shown in FIG. 6, comprises an inverter 111, 112, a resistor 113, a crystal oscillation element 116 and a pair of capacitors 117 and 118. The inverter comprises a P-channel type transistor 111 and an N-channel type transistor 112, and each of these transistors has a larger amplifying ability than other transistors in the semiconductor integrated circuit for imparting sharp rising and falling edges to the clock signal. For example, transistors 111 and 112 have an amplifying power from several times to several ten times that of a transistor in a logic circuit. Therefore, a current flowing through these transistors becomes large, and there has arisen a problem in that harmonic noise is produced prior to commencing the normal operating mode.

Furthermore, the harmonic noise is also produced during the normal operation mode, which causes the IC to malfunction.

SUMMARY OF THE INVENTION

Accordingly, an object of the present invention is to decrease the power consumption of an IC and also to reduce the generation of harmonic noise, during both the normal operation mode and the standby mode.

A more particular object of the present invention is to provide a semiconductor integrated circuit which is able to reduce power consumption and reduce the harmonic noise of an oscillator.

To achieve the above objects, the semiconductor integrated circuit of the present invention comprises a constant voltage generation circuit connected between a first voltage line for supplying the first voltage and a first node, and an oscillator connected between the first node and a second voltage line for generating a clock signal having an amplitude based on a voltage between the first node and the second voltage line, the constant voltage generation circuit supplying the first voltage to the first node until the clock signal is stabilized, and supplying a second voltage lower than the first voltage to the first node after the clock signal is stabilized.

Therefore, current flowing to the oscillation circuit is reduced, and the power consumption and generation of harmonic noise by the oscillation circuit is also reduced by this structure.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
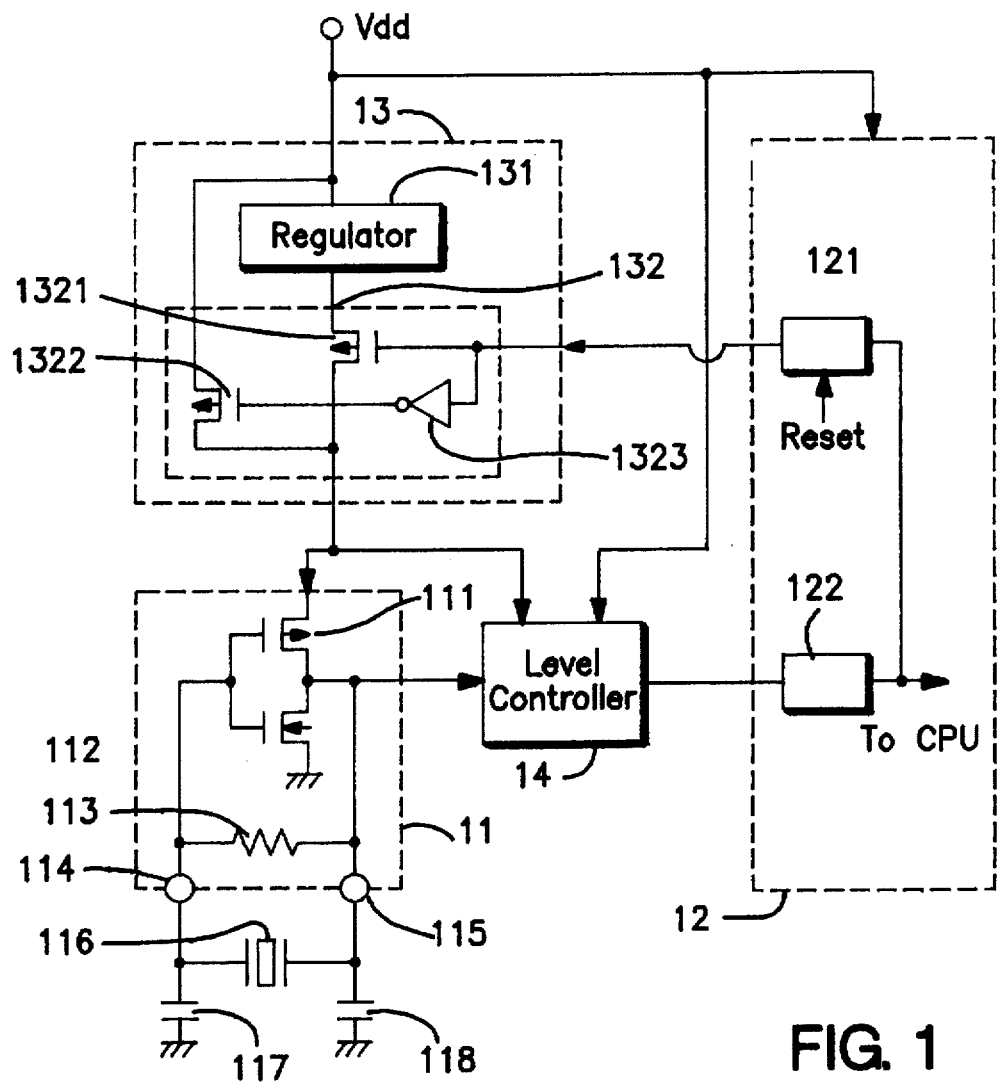
FIG. 1 is a block diagram showing a semiconductor integrated circuit in accordance with an embodiment of the present invention.

Referring to FIG. 1, a first embodiment of the semiconductor integrated circuit of the present invention includes an oscillation circuit 11, a logic circuit 12, a constant-voltage generation circuit 13, and a level conversion circuit 14.

The oscillation circuit 11 is comprised of a p-type transistor 111 and an n-type transistor 112 which constitute a CMOS inverter, and a feedback resistor 113, and is connected to capacitors 117 and 118 as well as an oscillation element 116 through oscillation element connecting terminals 114 and 115. The oscillation circuit 11, which is supplied with the output voltage of the constant-voltage generation circuit 13 as a supply voltage, makes the amplitude of an oscillation output fluctuate in accordance with the output voltage of the constant-voltage generation circuit 13.

Figure 3:
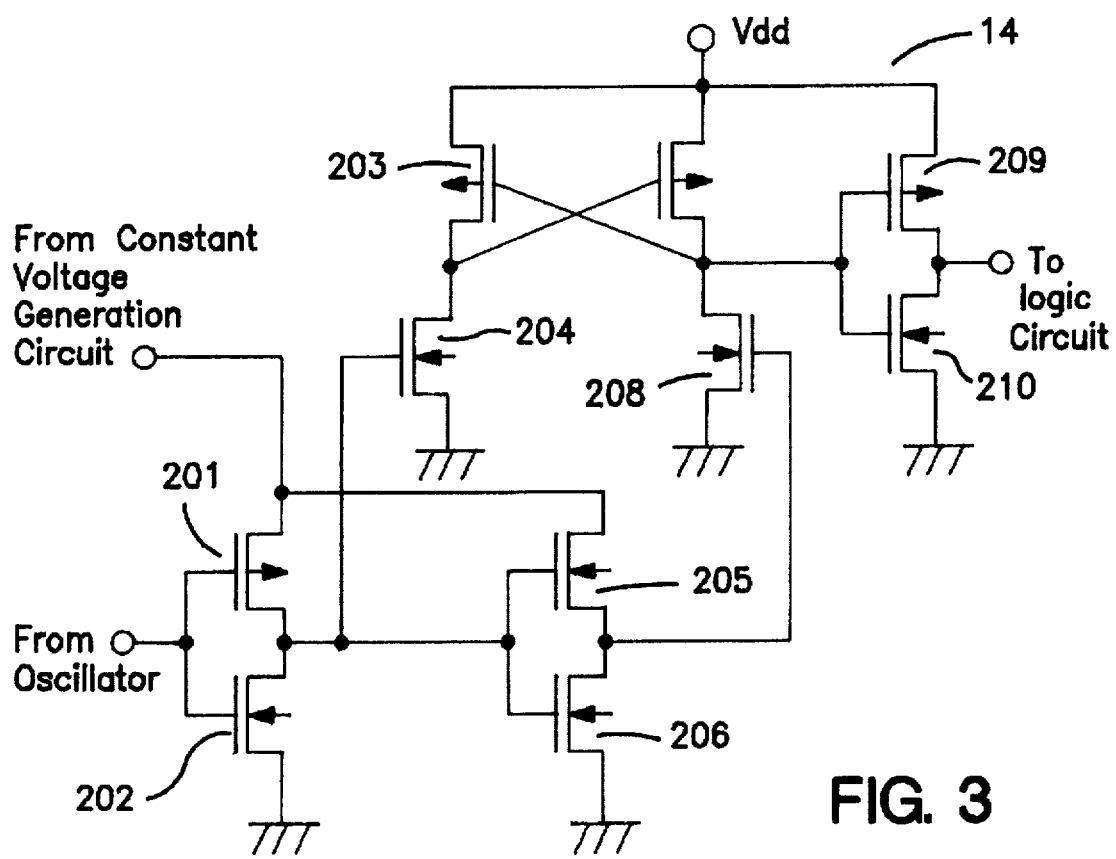
FIG. 3 is a circuit diagram showing the level conversion circuit of FIG. 1.
Figure 5:
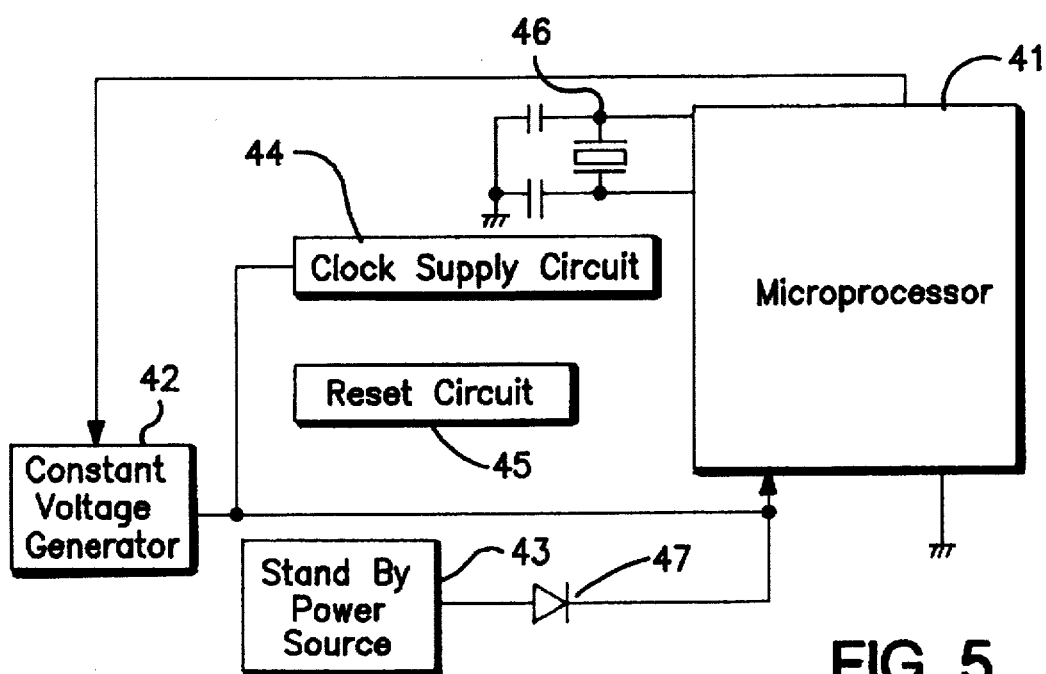
FIG. 5 is a block diagram showing a second conventional semiconductor integrated circuit.
Figure 6:
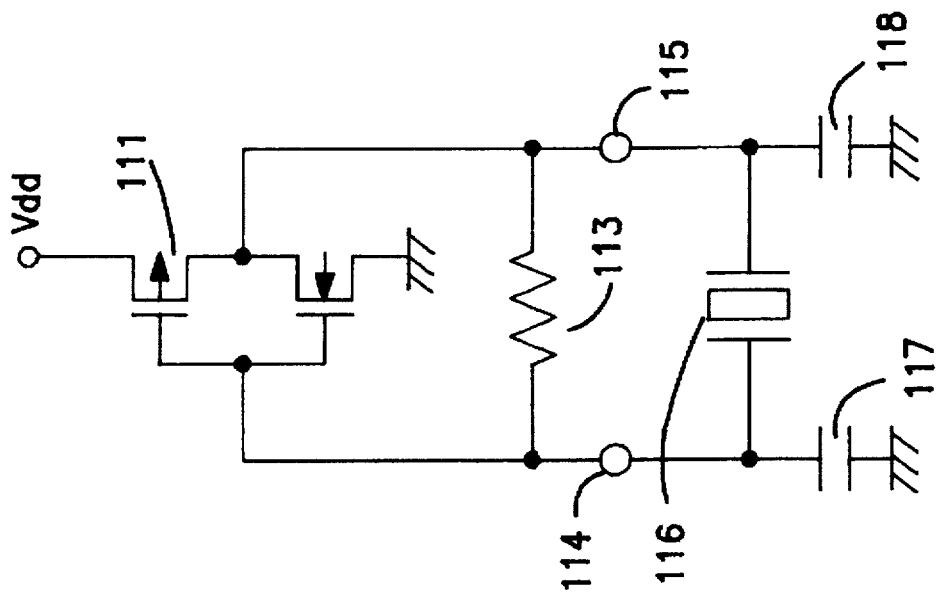
FIG. 6 is a circuit diagram showing a conventional oscillator.
Figure 4:
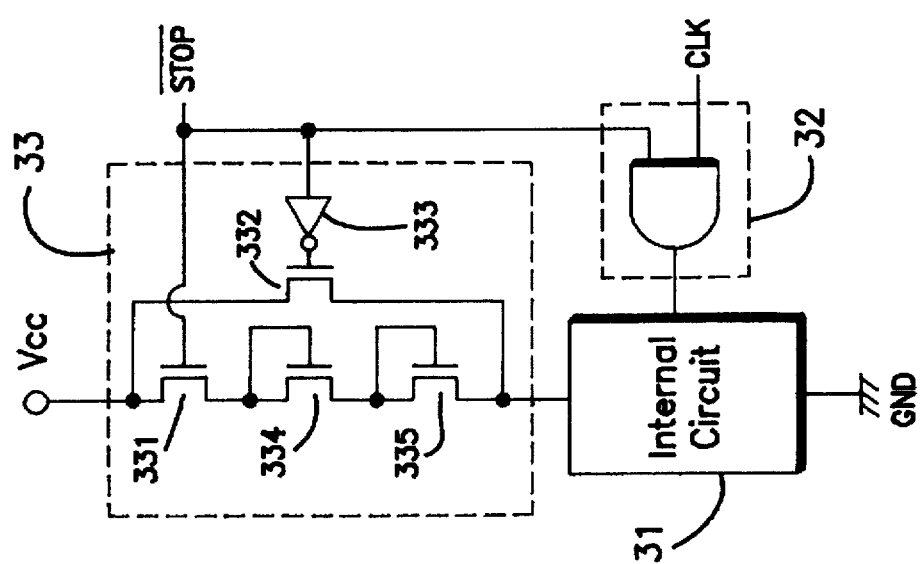
FIG. 4 is a block diagram showing a first conventional semiconductor integrated circuit.

The level conversion circuit 14 is comprised of a level shifter and supplied with the supply voltage to be applied to the logic circuit 12 and the output voltage of the constant-voltage generation circuit 13, so that it converts the level of the output amplitude of the oscillation circuit 11 which fluctuates in accordance with the output voltage of the constant-voltage generation circuit 13 during the operation of the logic circuit 12 into the logic amplitude of the logic circuit 12 to output a resultant signal to the logic circuit 12. For example, as shown in FIG. 3, the level conversion circuit 14 is comprised of P-channel type transistors 201, 203, 205, 207 and 209, and N-channel type transistors 202, 204, 206, 208 and 210.

The logic circuit 12 includes a frequency divider 122 for dividing a frequency of the clock signal, a start control circuit 121 and a central processing unit (CPU) (not shown) for executing the logic functions of the IC. Upon receiving the clock signal from the level conversion circuit 14, the frequency divider 122 generates a basic clock signal for the IC to be used as a system clock. The start control circuit 121 outputs, to the constant-voltage generation circuit 13, a start control signal having a pulse width covering a period from the oscillation start to the oscillation stabilization of the oscillation circuit 11. Also, the start control circuit 121 is reset by a Reset signal from CPU, whenever the oscillation circuit 11 begins generating the clock signal. For example, the start control circuit 121 comprises a counter for counting the number of clock signals.

The constant voltage generation circuit 13 includes a regulator 131 for reducing voltage, for example from 5V to 2V, and a switching circuit 132, and supplies an oscillation start voltage of 5V, or a lower oscillation holding voltage of 2V to a power supply terminal of the oscillation circuit 11 in accordance with the start control signal. The switching circuit 132 includes P-channel type transistors 1321 and 1322 and an inverter 1323 and is controlled in accordance with the start control signal from the start control circuit 121 when the period from the oscillation start to the oscillation stabilization of the oscillation circuit 11 passes to change over the output voltage of the constant-voltage generation circuit 13 from the supply voltage which serves as the oscillation start voltage to the oscillation holding voltage which is output from the regulator 131.

Figure 2:
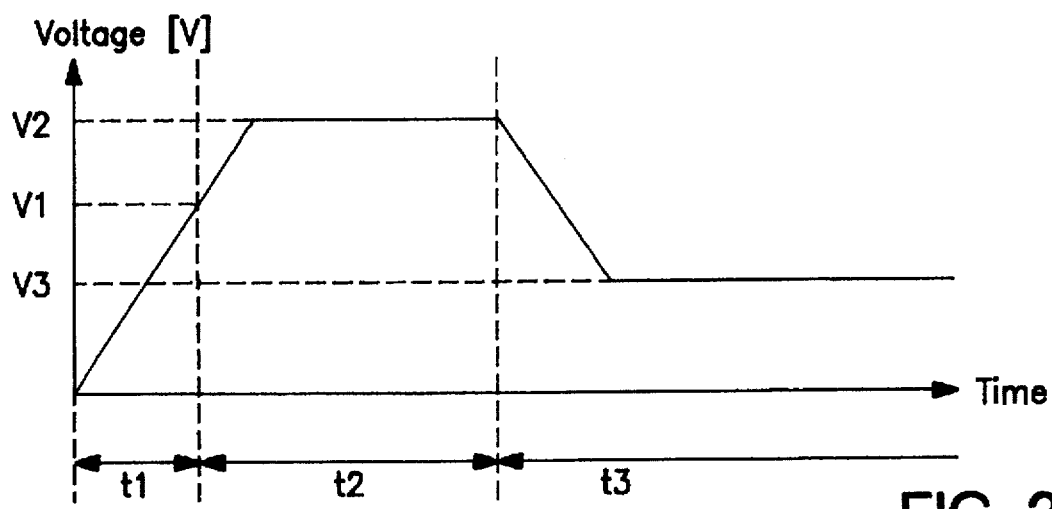
FIG. 2 is a transition diagram showing the transition of a supply voltage to the oscillation circuit 11 of FIG. 1.

FIG. 2 is a transition diagram showing the transition of a supply voltage to the oscillation circuit 11 shown in FIG. 1.

Immediately after turning on the power supply, the control circuit 121 in the logic circuit 12 of the IC is in a reset state, and outputs a high level as the start control signal to cause the rising of the pulse period t1 of the start control signal with the rising of the supply voltage. In this situation, the constant-voltage generation circuit 13 outputs the supply voltage as the oscillation start voltage because the switching transistor 1322 in the switching circuit 132 is conductive. The constant-voltage output of the constant-voltage generation circuit 13 rises up with the rising of the supplied voltage V1, for example to 3.5V, which is applied thereto, whereby the oscillation circuit 11 starts to oscillate.

Even after the supply voltage has risen up, the same supply voltage V2 as the supply voltage Vdd, 5V, which is applied to the logic circuit section 12 is applied to the oscillation circuit 11 during a period that covers an oscillation growth period t2 since the oscillation grows until it is stabilized. In general, an oscillator containing an oscillation element requires a given period from the oscillation start to the oscillation stabilization. As the supply voltage which is applied to the oscillator is higher, the amplitude factor of the CMOS inverter becomes increased, to thereby shorten a period to the oscillation stabilization. In fact, the oscillation circuit 11 generates the clock signal when the applied voltage becomes 3.5V as a minimum oscillation start voltage. However, the oscillation circuit 11 takes a long time to generate a stabilized clock signal when the applied voltage is 3.5V. Therefore, the constant-voltage generation circuit 13 applies 5V to the oscillation circuit 11 for generating a stabilized clock signal quickly.

After the oscillation of the oscillation circuit 11 has been stabilized, the start control circuit 121 allows the start control signal to go to a low level ending the pulse period. The constant-voltage generation circuit 13 applies the output of the regulator 131, which outputs the oscillation holding voltage of 2V which is lower than the oscillation start voltage, to the power supply terminal of the oscillation circuit 11 as a constant-voltage output because the switching transistor 1321 of the switching circuit 132 is rendered conductive by the start control signal. In this situation, a voltage lower than the oscillation start voltage by approximately 2 to 3V can be used as the oscillation holding voltage, depending on the design of the oscillation circuit. During the normal operation period t3 of the semiconductor integrated circuit, the oscillation circuit 11 which is supplied with the oscillation holding voltage as a supply voltage oscillates with an output amplitude conformable with the oscillation holding voltage V3.

Because a current flowing into the oscillator is determined in accordance with the frequency, the capacitor and the power consumption, the power consumption of the oscillator can be reduced by lowering the supply voltage which is applied to the oscillator. Also, because the output of the oscillator is made small in amplitude by lowering the supply voltage which is applied to the oscillator, the distortion of an output waveform which is caused by limitation of the substrate potential and the well potential of the semiconductor integrated circuit is reduced, thereby restraining the level of generated harmonic noise.

For example, in the 78K/0 series product which is an 8-bit single-chip microcomputer, when it is in a HALT state after the execution of a HALT command, the power consumption and the radiation level of the harmonic noise of the oscillator which oscillates at 4 MHz are compared. Then, the power consumption is reduced from 5.6 mW (5 V power supply) to 0.4 mW (2 V power supply), and the radiation level of the harmonic noise is reduced from −85 dbm (5 V power supply) to −95 dbm (2 V power supply). These are important characteristics for ICs which are frequently mounted on small-sized equipment of the hand-held type.

It should be noted that the start control circuit 121 shown in FIG. 1 can be realized by a flag circuit which is controlled by the command operation of the logic circuit section 12 a reset input of which is released, or it can be realized by the provision of an exclusive circuit where a period from the oscillation growth to the oscillation stabilization is set to count the output of the clock signal generation circuit 122. Also, a reset input containing a power-on reset signal can be used as a start control signal, depending on the design of the power-on reset time.

Also, the constant-voltage generation circuit 13 can be realized by a structure in which the regulator 131 and the switching circuit 132 are provided, and the switching circuit 132 consisting of the switching transistors 1321 and 1322 and the inverter 1323 is controlled in accordance with the start control signal of the start control circuit 121 to change over a reference voltage source of the regulator 131, in contrast to the embodiment shown in FIG. 1.

As mentioned above, the semiconductor integrated circuit according to the present invention includes the constant-voltage generation circuit having the switching circuit for changing over the operation supply voltage, which is applied to the oscillation circuit in accordance with the start control signal whose pulse width covers a period from the oscillation start to the oscillation stabilization of the oscillation circuit contained in the semiconductor integrated circuit, to a lower voltage, and the level conversion circuit for converting the level of the output amplitude of the oscillation circuit which fluctuates in accordance with the output voltage of the constant-voltage generation circuit into the logic amplitude of the logic circuit section. As a result, during the operation of the logic circuit, the operation supply voltage of the oscillation circuit can be lowered, and the power consumption during the normal operation of the semiconductor integrated circuit can be reduced also.

Further, the supply voltage which is applied to the oscillator can be reduced, thereby making the oscillation output of the oscillator small in amplitude. As a result, the distortion of an output waveform which is caused by limitation at the substrate potential and the well potential of the semiconductor integrated circuit is reduced, thereby restraining the level of the harmonic noise which is generated during the operation of the IC.

I claim:

1. A semiconductor integrated circuit comprising:

a constant voltage generation circuit connected between a first voltage line supplying a first voltage and a first node; and an oscillator connected between said first node and a second voltage line for generating a clock signal having an amplitude based on a voltage between said first node and said second voltage line, said oscillator having a first transistor of a first conductivity type connected between said first node and a second node and a second transistor of a second conductivity type opposite to said first conductivity type connected between said second node and said second voltage line;

said constant voltage generation circuit comprising means for supplying said first voltage to said first node until said clock signal is stabilized, and means for supplying a second voltage lower than said first voltage to said first node after said clock signal has been stabilized;

said constant voltage generation circuit further comprising a regulator connected between said first voltage line and a third node for supplying said second voltage to said third node, a first switching element connected between said first voltage line and said first node, and a second switching element connected between said first node and said third node, and means for rendering said first switching element and said second switching element conductive and non-conductive, respectively, until said clock signal is stabilized, and for rendering said first switching element and said second switching element non-conductive and conductive, respectively, after said clock signal is stabilized.

2. A semiconductor integrated circuit comprising:

a constant voltage generation circuit connected between a first voltage line supplying a first voltage and first node, said constant voltage generation circuit has a regulator connected between said first voltage line and a second node for supplying a second voltage to said second node, a first switching element connected between said first voltage line and said first node, and a second switching element connected between said first node and said second node;

an oscillator connected between said first node and a second voltage line generating a clock signal having an amplitude based on a voltage between said first node and said second voltage line; and a control circuit rendering said first switching element and said second switching element conductive and non-conductive, respectively, until said clock signal is stabilized, and rendering said first switching element and said second switching element non-conductive and conductive, respectively, after said clock signal is stabilized.

3. The semiconductor integrated circuit as claimed in claim 2, further comprising a level convertor connected to said first node for converting a first amplitude of said clock signal based on said second voltage to a second amplitude of a clock signal based on said first voltage and supplying said clock signal having said second amplitude to a logic circuit.

4. The semiconductor integrated circuit as claimed in claim 3, wherein said level convertor has a first inverter connected between said first node and said second voltage line, an input terminal of said first inverter receiving said clock signal, and an output terminal of said first inverter connected to a third node, a second inverter connected between said first node and said second voltage line, an input terminal of said second inverter connected to said third node, and an output terminal of said second inverter connected to a fourth node, a first transistor of a first conductivity type connected between said first voltage line and a fifth node and having a gate connected to a sixth node, a second transistor of said first conductivity type connected between said first voltage line and said sixth node and having a gate connected to said fifth node, a third transistor of a second conductivity type opposite to said first conductivity type connected between said fifth node and said second voltage line and having a gate connected to said third node, a fourth transistor of said second conductivity type connected between said sixth node and said second voltage line and having a gate connected to said fourth node, and a third inverter connected between said first voltage line and said second voltage line, an input terminal of said third inverter connected to said sixth node, and an output terminal of said third inverter connected to said logic circuit.

* * * * *